United States Patent [19]

Nishiyama

[11] Patent Number: 5,171,031
[45] Date of Patent: Dec. 15, 1992

[54] SEMICONDUCTOR FABRICATING APPARATUS

[75] Inventor: Sirou Nishiyama, Kawasaki, Japan

[73] Assignee: Kabushiki Kaisha Toshiba, Kawasaki, Japan

[21] Appl. No.: 593,988

[22] Filed: Oct. 9, 1990

[30] Foreign Application Priority Data

Oct. 9, 1989 [JP] Japan .................. 1-263443

[51] Int. Cl.5 .............................................. G01B 5/00
[52] U.S. Cl. ....................................... 279/133; 33/644
[58] Field of Search ......................... 279/1 L, 3, 133; 294/907, 2, 64.1; 118/500, 728, 730; 33/644, 645

[56] References Cited

U.S. PATENT DOCUMENTS

| 3,645,581 | 2/1972 | Lasch, Jr. et al. | 414/752 X |
|---|---|---|---|
| 4,011,659 | 3/1977 | Horvallius | 33/644 X |
| 4,282,825 | 8/1981 | Nayatoma et al. | 118/428 X |
| 4,563,824 | 1/1986 | Baun | 33/644 X |
| 4,635,373 | 1/1987 | Miyazaki et al. | 33/645 |
| 4,659,094 | 4/1987 | Leonov | 279/133 |
| 4,731,934 | 3/1988 | Barnaby et al. | 33/645 X |
| 4,790,545 | 12/1988 | Dzewaltowski et al. | 33/645 X |
| 4,821,393 | 4/1989 | Spigarelli | 29/759 X |
| 4,833,790 | 5/1989 | Spencer et al. | 33/644 X |
| 4,850,631 | 7/1989 | Dotsko | 294/907 X |
| 4,950,011 | 8/1990 | Borcea et al. | 294/2 |
| 5,108,117 | 4/1992 | Crossman et al. | 279/133 X |

FOREIGN PATENT DOCUMENTS 1309968 12/1989 Japan .................. 118/730

Primary Examiner—Larry Schwartz
Assistant Examiner—Robert Schultz
Attorney, Agent, or Firm—Foley & Lardner

[57] ABSTRACT

In a semiconductor fabricating apparatus having a wafer rotational processing device provided with a wafer chuck, a wafer centering mechanism comprising: a plurality of movable stops disposed with even angular spacing around the center of the chuck and being capable of being moved radially toward and away from that center thereby to clamp the periphery of a wafer conveyed onto the chuck and subsequently to release the same; a plurality of pairs of wafer position sensors disposed at spaced-apart positions in a single row along the path of advance of the wafer, the sensors of each pair being disposed on opposite sides of and equidistant from the chuck center, each sensor operating to detect whether or not a part of the wafer exists thereabove and to generate a corresponding output signal; and a stop moving mechanism for moving each of the movable stops in the manner stated.

12 Claims, 2 Drawing Sheets

SEMICONDUCTOR FABRICATING APPARATUS

BACKGROUND OF THE INVENTION

This invention relates generally to apparatuses for producing semiconductors and more particularly to improvements in the wafer centering mechanism in the wafer rotational processing device of a semiconductor fabricating apparatus.

As is known, in the production of various kinds of semiconductors, wafer rotational processing devices are used.

A conventional wafer rotational processing device has a wafer centering mechanism which generally comprises a wafer chuck in the center, a pair of wafer stops in mutually confronting state, and a shifting mechanism capable of moving these wafer stops in directions perpendicular to the direction of entrance of a wafer. A wafer is of circular disk shape, in general. The mutually confronting contact surfaces of the wafer stops are concave and are of semi-circular shape of a radius of curvature equal to one half of the outer diameter of the wafer to be processed as viewed in a direction perpendicular to the plane of the wafer.

When a wafer is fed into this wafer centering mechanism, and its center approaches the center of the wafer chuck, it is contacted by the semi-circular contact surfaces of the wafer stops approaching from their movable directions and is thereby clamped and centered. The organizational features and operation of this conventional wafer centering mechanism will be described in greater detail hereinafter with reference to a drawing.

In a conventional wafer rotational processing device with a wafer centering mechanism of the above described mechanical organization, the radius of curvature of the semi-circular contact surfaces of the wafer stops is fixed relative to the wafer diameter. For this reason wafers of different diameters could not be processed continuously in a mixed state.

Accordingly, it is an object of this invention to provide a semiconductor producing apparatus provided with a wafer centering mechanism capable of correctly centering continuously wafers of different diameters in mixed state for processing.

SUMMARY OF THE INVENTION

According to this invention, briefly summarized, there is provided a semiconductor fabricating apparatus having a wafer rotational processing device provided with a wafer chuck and a wafer centering mechanism comprising: a plurality of movable stops disposed with even angular spacing around the center of said chuck and being capable of being moved radially toward and away from said center thereby to clamp the periphery of a wafer conveyed onto said chuck and subsequently to release the same; a plurality of pairs of wafer position sensors disposed at spaced-apart positions in a single row along the path of advance of said wafer, the sensors of each said pair being disposed on opposite sides of and equidistant from said center, each sensor operating to detect whether or not a part of said wafer exists thereabove and to generate a corresponding output signal; and a stop moving mechanism for moving each of the movable stops in the manner stated.

In the semiconductor fabricating apparatus according to this invention of the above described organization, even when wafers of various different diameters are to be processed, each wafer can be centered and fixed with high precision for processing. Moreover, simultaneously with the centering of each wafer, the diameter thereof can be determined. Therefore, depending on the necessity, the wafer diameter can be indicated.

The nature, utility, and further features of the present invention can be more clearly apparent from the following detailed description with respect to a preferred embodiment of the invention when read in conjunction with the accompanying drawings.

DETAILED DESCRIPTION OF THE PREFERRED EMBODIMENT

As conducive to a full understanding of this invention, the general nature and limitations of the wafer centering mechanism in a conventional wafer rotational processing device will first be briefly described with reference to FIG. 2.

Figure 2:
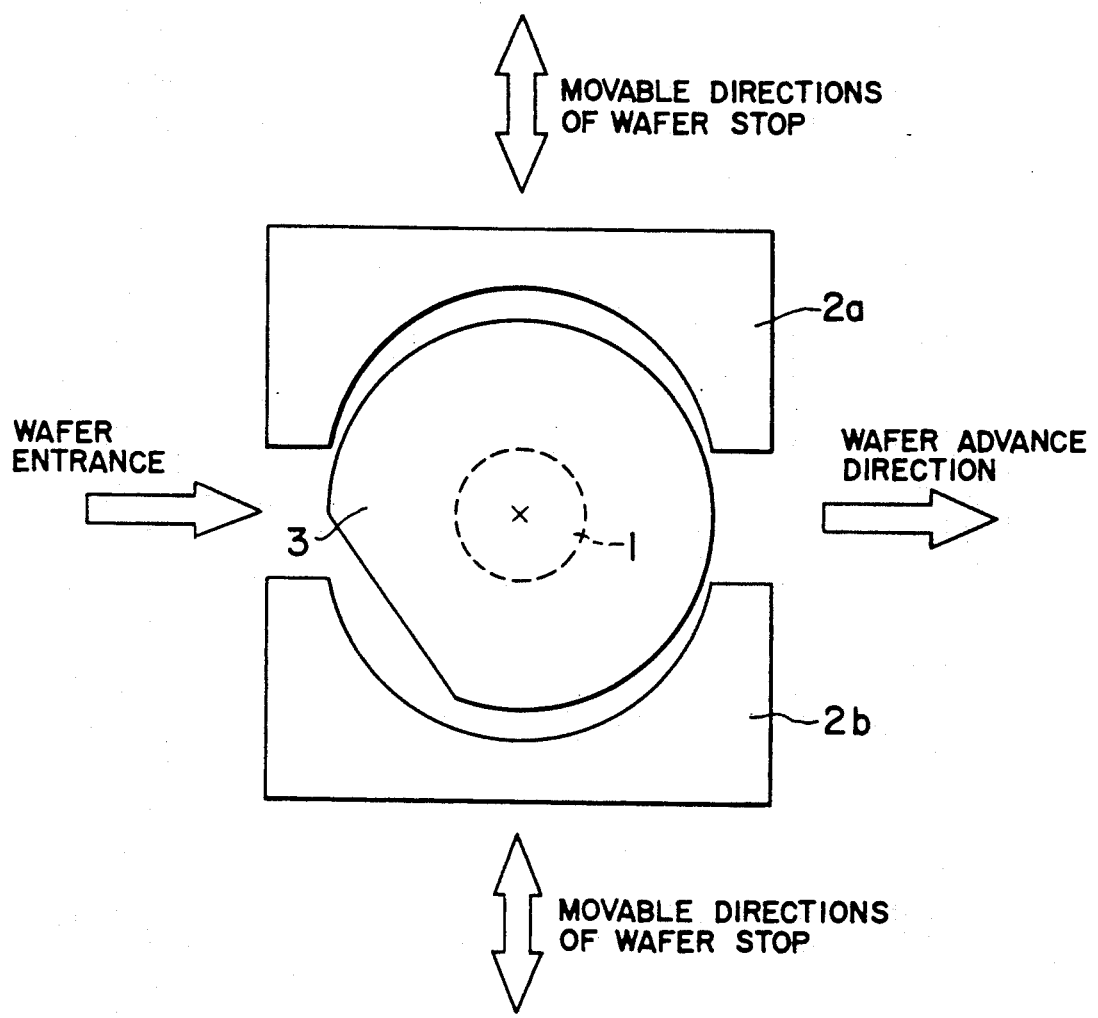
FIG. 2 is a similar diagram showing the essential parts of a wafer centering mechanism of the prior art.

As shown in FIG. 2, the wafer centering mechanism comprises essentially a wafer chuck 1 defining a center, a pair of mutually opposed wafer stops 2a and 2b, and a shifting or moving mechanism (not shown) capable of moving these wafer stops in directions perpendicular to the direction of entrance of a wafer 3. The confrontally opposed surfaces respectively of the wafer stops 2a and 2b are formed as concave contact surfaces of semicircular arcuate shape of a radius of curvature equal to one half of the outer diameter of the wafer 3 to be processed as viewed perpendicularly to the plane of the wafer 3.

In a wafer centering mechanism of this mechanical organization, the following operation takes place. A wafer 3 is driven by a wafer conveying system (not shown) and enters this mechanism. When the center of this wafer 3 comes into the vicinity of the wafer chuck 1, the wafer leaves the wafer conveying system and contacts and is clamped by the contact surfaces of the wafer stops 2a and 2b approaching from the wafer stop movable directions as shown in FIG. 2. Thus the wafer is centered.

In a conventional wafer rotational processing device, the wafer stops 2a and 2b of the wafer centering mechanism for contacting the wafer 3 have contact surfaces of a radius of curvature which is fixed relative to the wafer diameter. For this reason, it has not been possible to process continuously wafers of different diameters in mixed state as mentioned hereinbefore.

The present invention seeks to overcome this limitation by providing a semiconductor fabricating apparatus as summarized hereinbefore and as described in detail hereinbelow with respect to a preferred embodiment of the invention.

Figure 1:
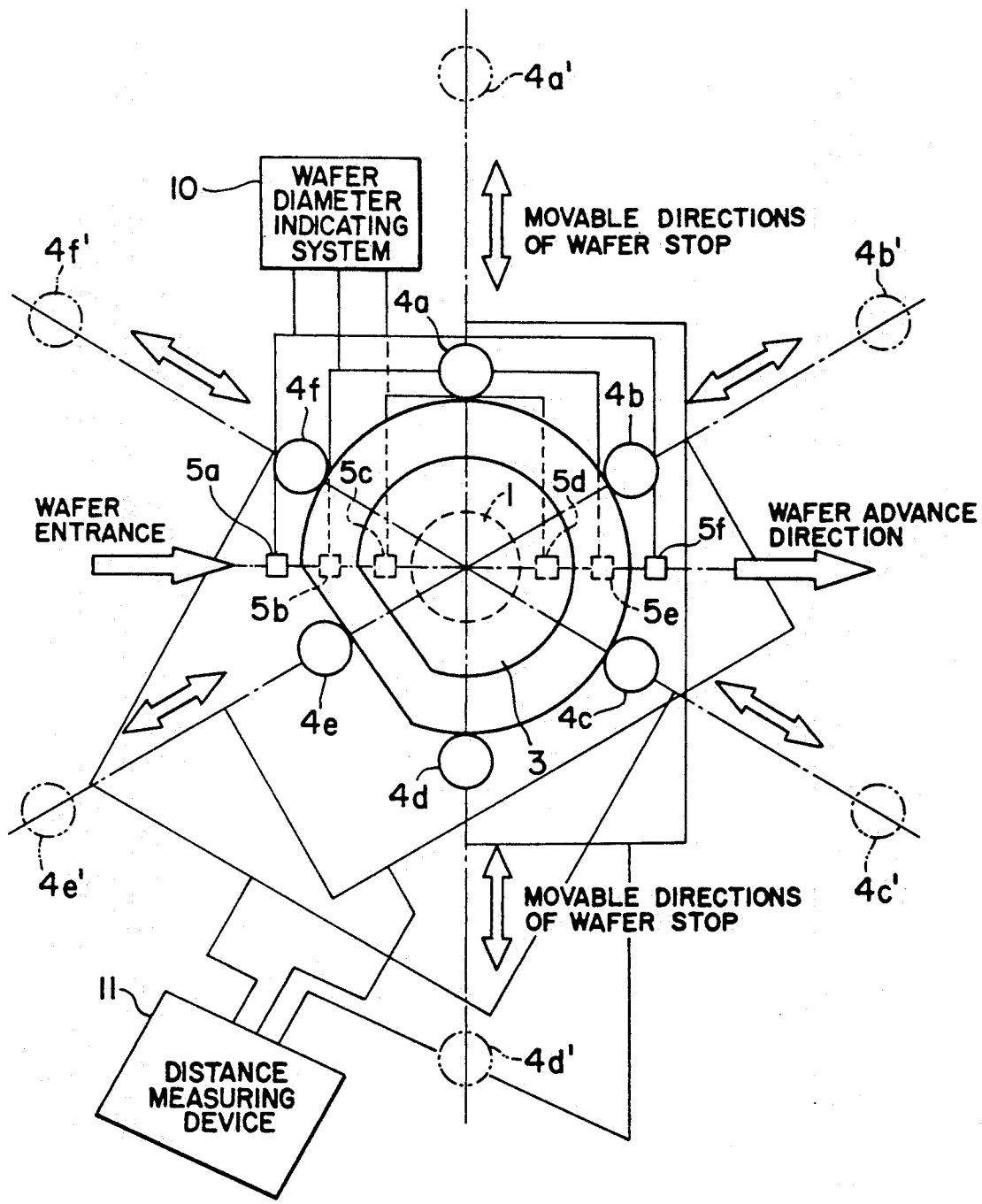
FIG. 1 is schematic diagram of one example of a wafer centering mechanism in the semiconductor fabricating apparatus of this invention.

In one embodiment of this invention as shown in FIG. 1, six movable stops 4a, 4b, 4c, 4d, 4e, and 4f for wafer centering are disposed around a wafer chuck 1 at angular spacing intervals of 60 degrees. Each of these movable stops is in the form of a pin of a small diameter which is much smaller than the diameter of any wafer 3 to be centered. Each movable stop is so movably supported that it can move translationally in radial directions toward and away from the center of the wafer chuck over a specific movable range. Each movable stop is thus moved by a stop moving mechanism (not shown).

Figure 3:
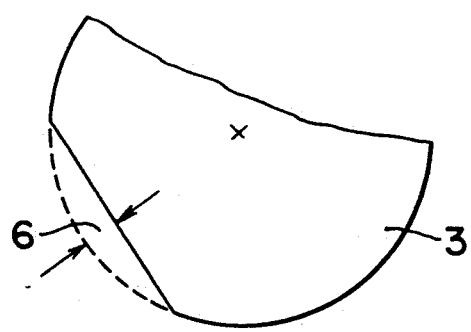
FIG. 3 is a fragmentary plan view of a wafer, showing an orientation flat formed therein.

The above mentioned "specific movable range" means the range from a first position which is obtained by subtracting the orientation flat quantity (designated by reference numeral 6 in FIG. 3) or more from the radius of wafer 3 of the smallest diameter among the wafers of different diameters to be processed in mixed state, to a second position which is slightly outside of the outer diameter of the wafer of the maximum radius to be processed, as designated by reference numerals 4a', 4b', 4c', 4d', 4e', or 4f'.

In addition, six wafer position sensors 5a, 5b, 5c, 5d, 5e, and 5f are disposed along the direction of advance of each wafer 3. Of these wafer position sensors, 5a and 5f, 5b and 5e, and 5c and 5d respectively become pairs, the two sensors of each pair being equidistant from the center of the wafer chuck 1 as a datum point on opposite sides of the center.

In the case where a wafer 3 exists above each of the wafer position sensors 5a through 5f in the semiconductor fabricating apparatus of the above described organization according to this invention, the polarity of that wafer position sensor, by definition, is made ON and is made OFF in the case where a wafer 3 does not exist. Moreover, if it is assumed that the wafer 3 advances in the direction from sensor 5a to sensor 5f, three conditions of 1) the wafer position sensors 5a through 5f being ON, 2) sensors 5b through 5e only being ON, and 3) sensors 5c and 5d only being ON are possible. When any one of these three conditions is obtained, it is judged that the wafer 3 has been approximately set above the wafer chuck 1.

In the case where the number of wafer position sensors is greater, also, the wafer 3 is judged to have been approximately set above the wafer chuck 1 only when sensors equidistant from the center of the wafer chuck 1 are both in ON state.

At the same time, the sensor outputs from the sensors 5a through 5f are transmitted to a wafer diameter indicating system 10, which thereupon indicates the diameter of the wafer 3 that has been approximately set above the wafer chuck 1.

When, as described above, it has been judged that the wafer 3 has been approximately set above the wafer chuck 1, the plurality (more than two) of movable stops 4a through 4f for wafer centering disposed on a common circle move at equal speed toward the center of the wafer chuck 1 in a manner to hem in the periphery of the wafer 3. The movable stops thus contact, press against, and thus fixedly clamp the wafer.

In this case, the distances of the three systems between the movable stops for wafer centering, that is, between 4a and 4d, between 4b and 4e, and between 4c and 4f, are measured by a distance measuring device 11. If the difference between the measurements of two systems of the resulting measurements close to each other of these three systems is less than the orientation flat quantity 6, shown in FIG. 3, it is judged that the centering of the wafer 3 relative to the wafer chuck 1 has been completed.

In the foregoing description, mention has been made of a stop moving mechanism for moving each of the stops in radial directions toward and away from the wafer chuck center, a wafer diameter indicating system for operating in response to output signals from the wafer position sensors to indicate the wafer diameter, and the distance measuring device for measuring distances between pairs of opposed wafer stops. Since each of these mechanisms, system, and device are well known or can be constituted by a combination of known components and per se are not of inventive nature, description and, for the stop moving mechanism illustration thereof have been omitted.

As described above, the present invention provides a semiconductor fabricating apparatus in which, even when wafers being processed continuously are of different diameters, each wafer can be centered with high precision relative to the water chuck. Furthermore, simultaneously with centering of each wafer, the diameter of that wafer can also be indicated if necessary.

What is claimed is:

1. A semiconductor fabricating apparatus having a wafer rotational processing device provided with a wafer chuck and a wafer centering mechanism comprising: a plurality of movable stops disposed with even angular spacing around the center of said chuck and being capable of being moved radially toward and away from said center thereby to clamp the periphery of a wafer conveyed onto said chuck and subsequently to release the same; a plurality of pairs of wafer position sensors disposed at spaced-apart positions in a single row along the path of advance of said wafer, the sensors of each said pair being disposed on opposite sides of and equidistant from said center, each sensor operating to detect whether or not a part of said wafer exists thereabove and to generate a corresponding output signal; and a stop moving mechanism for moving each of the movable stops in the manner stated.

2. A semiconductor fabricating apparatus as claimed in claim 1 further provided with wafer diameter indicating means operating in response to said output signals from said wafer position sensors to indicate the diameter of the wafer being centered.

3. A semiconductor fabricating apparatus as claimed in claim 1 in which said movable stops are in the form of pins with respective axes perpendicular to the plane of the wafer being centered and are in pairs of said pins disposed on diagonally opposite sides of said center.

4. A semiconductor fabricating apparatus as claimed in claim 3 further provided with distance measuring means for measuring the distance between each said pair of pins.

5. A semiconductor fabricating apparatus as claimed in claim 2 in which said movable stops are in the form of pins with respective axes perpendicular to the plane of the wafer being centered and are in pairs of said pins disposed on diagonally opposite sides of said center.

6. A semiconductor fabricating apparatus as claimed in claim 5 further provided with distance measuring means for measuring the distance between each said pair of pins.

7. A semiconductor fabricating apparatus having a wafer rotational processing device provided with a wafer chuck and a wafer centering mechanism comprising:

a plurality of movable stops disposed with angular spacing around the center of said chuck and being capable of being moved radially toward and away from said center thereby to clamp the periphery of a wafer conveyed onto said chuck and subsequently to release the same; and a plurality of pairs of wafer position sensors disposed at spaced-apart positions along a path of advance of said wafer, the sensors of each said pair being disposed on opposite sides of and equidistant from said center, each sensor operating to detect whether or not a part of said wafer exists thereabove and to generate a corresponding output signal.

8. A semiconductor fabricating apparatus as claimed in claim 7 further provided with wafer diameter indicating means operating in response to said output signals from said wafer position sensors to indicate the diameter of the wafer being centered.

9. A semiconductor fabricating apparatus as claimed in claim 7 in which said movable stops are in the form of pins with respective axes perpendicular to the plane of the wafer being centered and are in pairs of said pins disposed on diagonally opposite sides of said center.

10. A semiconductor fabricating apparatus as claimed in claim 9 further provided with distance measuring means for measuring the distance between each said pair or pins.

11. A semiconductor fabricating apparatus as claimed in claim 8 in which said movable stops are in the form of pins with respective axes perpendicular to the plane of the wafer being centered and are in pairs of said pins disposed on diagonally opposite sides of said center.

12. A semiconductor fabricating apparatus as claimed in claim 11 further provided with distance measuring means for measuring the distance between each pair of pins.

* * * * *